(12) United States Patent
Mashiko et al.

(10) Patent No.: US 6,696,179 B2
(45) Date of Patent: Feb. 24, 2004

(54) FIXING MEMBER, ELECTROLUMINESCENT DEVICE USING THE MEMBER AND BACKING SUBSTRATE FOR THE DEVICE

(75) Inventors: Hiroaki Mashiko, Osaka (JP); Hiroyuki Nishii, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/813,126

(22) Filed: Mar. 21, 2001

(65) Prior Publication Data

US 2001/0033946 A1 Oct. 25, 2001

(30) Foreign Application Priority Data

Mar. 23, 2000 (JP) ......................... 2000-082889

(51) Int. Cl.⁷ .................. H05B 33/00; B32B 3/02; B32B 5/18
(52) U.S. Cl. ............... 428/690; 428/76; 428/192; 428/317.1; 428/332; 428/343; 428/422; 428/500; 428/917; 313/512; 257/100
(58) Field of Search .................. 428/690, 192, 428/76, 317.1, 332, 343, 422, 500, 917; 313/512; 257/100

(56) References Cited

U.S. PATENT DOCUMENTS 4,357,557 A * 11/1982 Inohara et al. .............. 313/509

| 5,189,405 A | * | 2/1993 | Yamashita et al. | 340/781 |
|---|---|---|---|---|
| 5,882,761 A | | 3/1999 | Kawami et al. | 428/69 |
| 6,081,071 A | * | 6/2000 | Rogers | 313/512 |
| 6,198,220 B1 | * | 3/2001 | Jones et al. | 313/512 |
| 6,210,815 B1 | * | 4/2001 | Ooishi | 428/690 |
| 6,268,695 B1 | * | 7/2001 | Affinito | 313/504 |
| 6,280,559 B1 | * | 8/2001 | Terada et al. | 156/295 |
| 6,284,342 B1 | * | 9/2001 | Ebisawa et al. | 428/69 |

FOREIGN PATENT DOCUMENTS

| EP | 0 500 382 A2 | 8/1992 | |
|---|---|---|---|
| EP | 0 969 700 A1 | 1/2000 | |
| EP | 1 115 267 A2 | 7/2001 | |
| JP | 9-148066 | 6/1997 | ........... H05B/33/04 |

OTHER PUBLICATIONS

"Teflon", Grant and Hackh's Chemical Dictionary, Fifth Edition, McGraw-Hill Book Company, 1987, p. 577.*
European Search Report dated Mar. 3, 2003.

* cited by examiner

Primary Examiner—Cynthia H. Kelly
Assistant Examiner—Dawn Garrett
(74) Attorney, Agent, or Firm—Sughrue Mion, PLLC

(57) ABSTRACT

Described are a fixing member formed of a sheet material equipped with a gas permeable portion covering a removing agent at a portion other than the peripheral portion of the sheet material, and an adhesion member disposed at the peripheral portion of the sheet material; an EL device using the fixing member; and a backing substrate of the EL device. Use of the fixing member contributes to a reduction in the manufacturing cost of an EL device.

28 Claims, 3 Drawing Sheets

FIXING MEMBER, ELECTROLUMINESCENT DEVICE USING THE MEMBER AND BACKING SUBSTRATE FOR THE DEVICE

FIELD OF THE INVENTION

The present invention relates to a fixing member for fixing, inside of an electroluminescent (which will hereinafter be abbreviated as "EL") device, a removing agent of a predetermined gas component in the EL device; an EL device using the fixing member; and a backing substrate for the EL device.

BUCKGROUND OF THE INVENTION

For displays or light emitting elements of various apparatuses such as mobile apparatuses, EL devices have conventionally been used as an emitter. EL devices are however accompanied with such a drawback that luminous performances such as luminance and luminous uniformity are extremely deteriorated under high temperature conditions or with the passage of a predetermined time, compared with those at an initial stage. Such a deterioration in luminous performances is known to be caused by appearance of non-luminous portions (dark spots) inside of the EL device due to water adsorbed to the surface of a component part or component material of the EL device, or water or a gas such as oxygen or organic gas penetrated from the outside.

With a view to removing the above-described causes for deterioration of luminous performances (appearance of dark spots), proposed in JP-A-9-148066 (the term "JP-A" as used herein means an "unexamined published Japanese patent application) is an EL device equipped inside thereof with drying means formed from a compound which chemically adsorbs water and at the same time, maintains a solid condition even if absorbing humidity. After solidification, the compound to be drying means is fixed inside of this device.

The above-described EL device, however, requires a step for solidifying the compound to be drying means, thereby needing time and equipment for solidification. It therefore involves the problem that a manufacturing cost becomes higher.

SUMMARY OF THE INVENTION

With the foregoing in view, the present invention has been completed. An object of the present invention is to provide a fixing member capable of suppressing the manufacturing cost of an EL device, an EL device using the fixing member and a backing substrate for the device.

With a view to attaining the above-described object, the present invention provides, in a first aspect, a fixing member for fixing a removing agent of a predetermined gas component, said fixing member comprising a sheet material equipped with a gas permeable portion which covers the removing agent at a portion other than the peripheral portion of the sheet material and an adhesion member disposed at the peripheral portion of the sheet material; in a second aspect, an EL device using the fixing member; and, in a third aspect, a backing substrate of the EL device.

The fixing member of the present invention is formed of a sheet material equipped with a gas permeable portion which covers the removing agent at a portion other than the peripheral portion of the sheet material and an adhesion member disposed at the peripheral portion of the sheet material. The fixing member can therefore be easily adhered to the inner surface of the EL device in such a manner that the removing agent is covered with the member and sandwiched between the member and the inner surface. Such a constitution does not require solidification of the removing agent, leading to a reduction in the manufacturing cost of an EL device.

When the gas permeable portion of the fixing member of the present invention is made of a porous substance composed of polytetrafluoroethylene (PTFE), its excellent heat resistance enables the stable use of the EL device even under a heated environment.

When the gas permeable portion of the fixing member of the present invention is made of a porous substance composed of a high polymer having a crystal structure, the performance of removing a predetermined gas component inside the EL device can be controlled easily, because the high polymer having a crystal structure is a material facilitating the adjustment of the pore size of the porous substance.

When the gas permeable portion of the fixing member of the present invention is made of a porous substance composed of a thermoplastic resin, its excellent processability permits easy processing of the gas permeable portion.

When a polyolefin-series resin is used as the thermoplastic resin in the fixing member of the present invention, the performance of removing a predetermined gas component inside the EL device can be controlled easily, because the polyolefin-series resin is a material facilitating the adjustment of the pore size of the porous substance. In addition, use of an inexpensive polyolefin-series resin contributes to a reduction in the manufacturing cost of the EL device. Moreover, recycling of the easily-recyclable material after use contributes to a reduction of dust.

As an adhesive used for the adhesion member of the present invention, any adhesive is usable insofar as it has a gel fraction of 70 wt. % or greater, preferably from 80 to 99 wt. %, in at least one organic solvent selected from toluene, xylene, cyclohexanone, ethanol, isopropyl alcohol, diethyl ether, hexane, carbon tetrachloride, chloroform, dimethylformamide (DMF), n-methyl-2pyrrolidone (NMP) and tetrahydrofuran, under the stable condition of the adhesive, that is, after setting when the adhesive is a setting type adhesive, after sufficient cooling when the adhesive is a hot-melt adhesive or after a sufficient time has passed since adhesion when the adhesive is a pressure-sensitive adhesive. Adhesives having a gel fraction less than 70 wt. % in any one of the above-exemplified organic solvents have considerably good compatibility therewith so that a gas of an organic substance tends to be released from the adhesive when it is integrated in the EL device. The "gel fraction of an adhesive" as used herein is measured as follows: first, the initial weight ($W_1$) of an adhesive sample (about 0.1 g) is measured and then the sample is charged in a target organic solvent (about 100 ml) to immerse the former in the latter at room temperature for 168 hours (7 days). A portion which has not yet gelled is dissolved in the organic solvent. After drying the insoluble matter, the weight ($W_2$) of the residue (gelled portion) was measured and the gel fraction is calculated based on the following equation (1):

$$\text{Gel fraction (wt. \%)} = (W_2/W_1) \times 100 \tag{1}$$

In the fixing member of the present invention, the thickness of the adhesion member ranges from 1 to 5000 preferably 5 to 1000 μm from the viewpoint of the handling use.

When the adhesion member constituting the fixing member of the present invention is a laminate having, inside thereof, a base layer, the modulus of elasticity of the fixing member can be raised, which improves the working efficiency upon fixing of the fixing member, thereby making it possible to actualize the automated manufacture of the EL device.

In the EL device using the fixing member of the present invention, the fixing member has a simple structure formed of a sheet material and an adhesion member so that it can be adhered to the inner surface of the EL device easily, leading to a suppression of the manufacturing cost thereof.

In the EL device using the fixing member of the present invention, a removing agent is attached in advance to the backing substrate of the device, which facilitates the manufacturing work of the EL device.

Legends
8: removing agent
9: fixing member
10: sheet material
10a: gas permeable portion
11: adhesion member

DETAILED DESCRIPTION OF THE INVENTION

Figure 1:
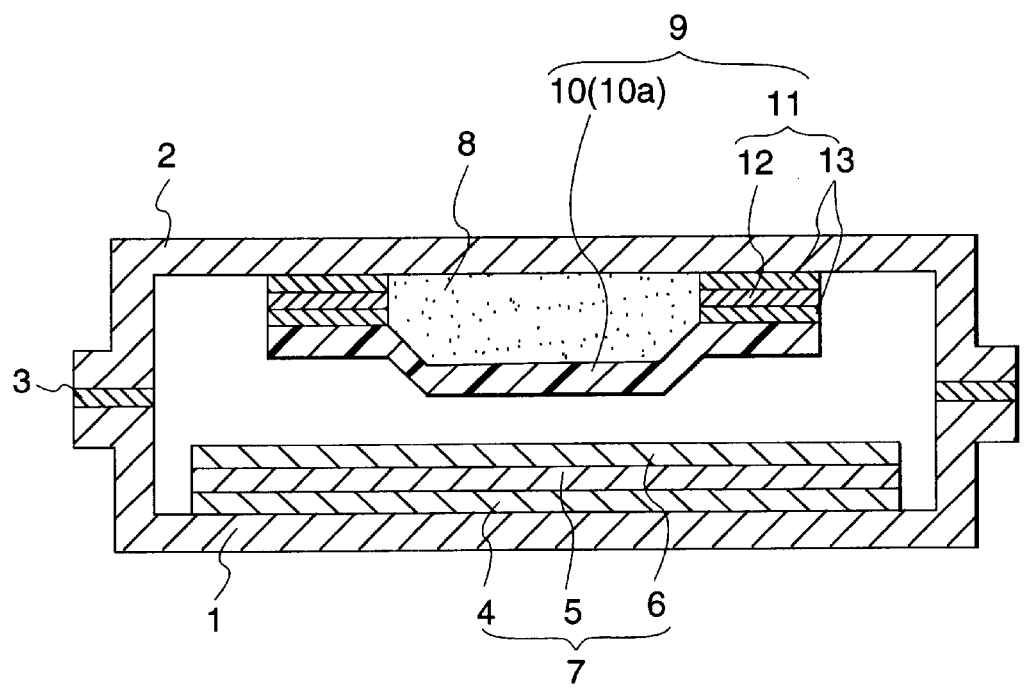
FIG. 1 is a schematic view illustrating the fixing member and EL device using it according to one embodiment of the present invention.

The embodiments of the present invention will next be described more specifically based on accompanying drawings. FIG. 1 illustrates the fixing member and EL device using the fixing member according to one embodiment of the present invention. This EL device is an organic EL device obtained by sealing a surface substrate 1 and a backing substrate 2, each in a dish-like form, with a sealant 3 so that their recessed portions are faced each other. On the upper surface of the dish-like recessed portion of the surface substrate 1, an anode 4, an organic light emitting layer 5 and a cathode 6 are stacked successively one after another in this order, thereby constituting a laminate 7, while on the bottom surface (inside surface) of the dish-like recessed portion of the backing substrate 2, a removing agent 8 for removing a predetermined gas component is fixed by a fixing member 9. This fixing member 9 is formed of a sheet material 10 composed of a gas permeable portion 10a having gas permeability all over and an adhesion member 11 formed at the peripheral portion on one side of this sheet material 10. This adhesion member 11 is a laminate of three layers (a base layer 12 and adhesive layers 13 disposed on both sides of this base layer) having, inside thereof, one base layer 12. The fixing member 9 is adhered onto the lower surface of the dish-like recessed portion of the backing substrate 2 and the removing agent 9 covered by it is sandwiched and fixed between it and the lower surface of the recessed portion. The removing agent 8 serves to remove a predetermined gas component through the gas permeable portion 10a of the sheet material 10. Here, the laminate 7 is formed on the surface substrate 7, while the backing substrate 2 is on the side opposite to the laminate-formed side.

The constitution will next be described more specifically. There is no particular limitation is imposed on the gas permeable portion 10a of the sheet material 10 insofar as it has gas permeability (including moisture permeability). Preferred examples include a porous substance composed of PTFE, a porous substance composed of a high polymer having a crystal structure and a porous substance composed of a thermoplastic resin. If the sheet material is not required to have a high gas permeability, a non-porous substance made of such a material can also be used as the gas permeable portion 10a. At least two of the above-exemplified materials may be mixed, laminated or combined to form the gas permeable portion 10a. Although no limitation is imposed on the thickness or porosity of the gas permeable portion 10a, the former usually ranges from 1 to 3000 $\mu$m, preferably from 5 to 1000 $\mu$m and the latter usually ranges from 2 to 98%, preferably from 30 to 95%. Also on the pore size of the gas permeable portion 10a, no limitation is imposed insofar as it does not permit the permeation of the above-described removing agent 8. It preferably ranges from 0.01 to 100 $\mu$m, more preferably from 0.03 to 10 $\mu$m. Particularly when there is a possibility of the sheet material 10 being brought into contact with the cathode 6 of the EL device, the sheet material 10 preferably has cushioning properties. When the gas permeable portion 10a is made of a porous substance composed of PTFE, it preferably has a thickness of 10 $\mu$m or greater, more preferably from 10 to 1000 $\mu$m, in consideration of an improvement in the modulus of elasticity. As the above-described high polymer having a crystal structure or thermoplastic resin, polyolefin-series resins such as polyethylene resin, polypropylene resin, poly-4-methyl-pentene-1, poly-1-butene, and polyvinylidene fluoride are preferred. These polyolefin-series resins may be used as a simple substance or a copolymer, or at least two of them may be used as a mixture.

There is no particular limitation imposed on the adhesive of the adhesive layer 13 constituting the adhesion member 11. Examples of the adhesive usable for it include pressure-sensitive adhesives, hot melt adhesives, adhesives set by exposure to ultraviolet rays, heat, humidity or the like, two-part adhesives and cold-setting adhesives. Pressure-sensitive adhesives made of a silicone, acrylic or rubbery material are particularly preferred.

The above-described base layer 12 is made of a thermoplastic film, thermosetting plastic film, metal foil or nonwoven cloth.

There is no particular limitation imposed on the removing agent 8 and as the removing agent, for example, compounds ordinarily employed as an adsorbent, humidity absorber (desiccant) or deoxidation agent (free-oxygen absorber) are used. Among them, a compound having a capacity of removing at least one substance selected from the group consisting of water vapor, oxygen and vapors of organic substances is preferred as the removing agent 8. As the desiccant, any compound capable of physically adsorbing water thereto or any compound capable of chemically reacting with water can be used. Examples include silica gel, molecular sieves (zeolite, etc.), active alumina, alkali metal oxides, alkaline earth metal oxides, sulfates, metal halides, perchlorates, carbonates, phosphorus pentaoxide, calcium hydroxide, aluminum lithium hydroxide, active metals and organic substances. Examples of the above-described deoxidation agent include activated carbon, silica gel, molecular sieves, magnesium oxide and iron oxide. Examples of the adsorbent of an organic gas include activated carbon, silica gel and molecular sieves. As the removing agent 8, a plurality of the above-exemplified inorganic compounds and/or the organic substances may be mixed. They can also be used after mixed under heat with a synthetic resin, which serves as a binder, and then solidified.

Figure 2:
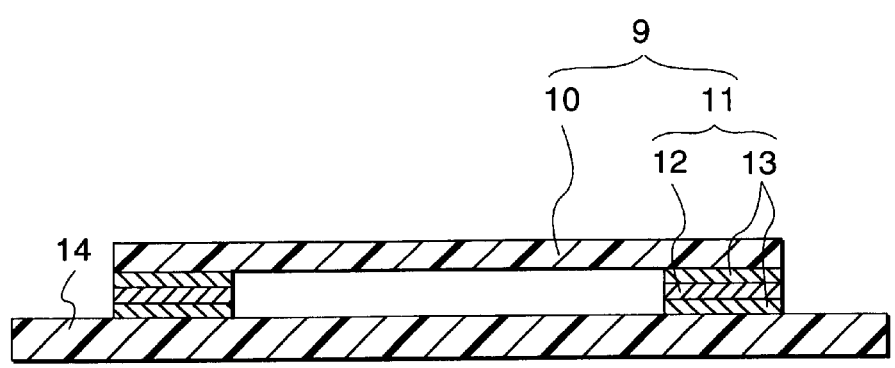
FIG. 2 is a schematic view illustrating the manufacturing process of the fixing member.
Figure 3:
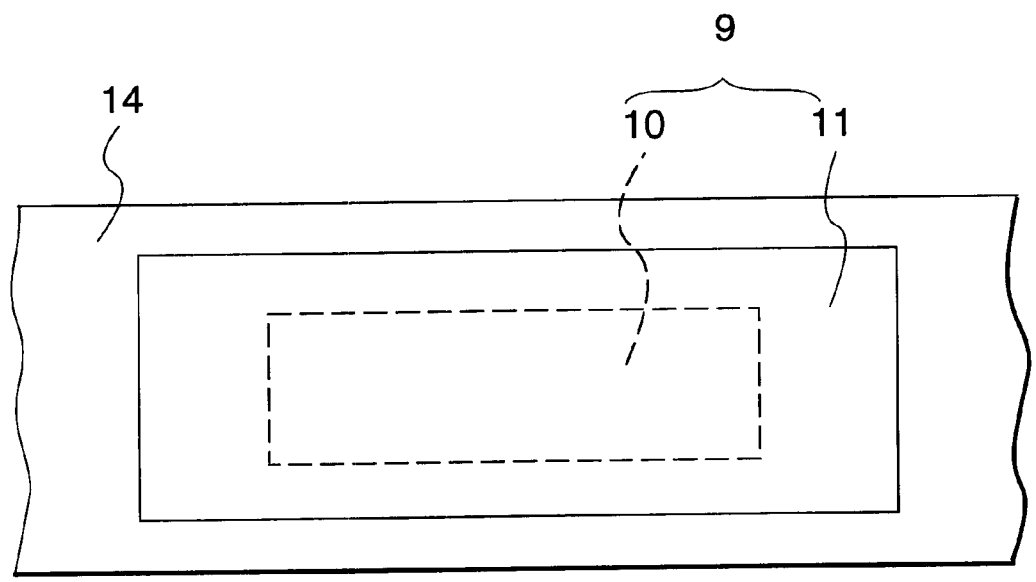
FIG. 3 is a schematic top view illustrating the manufacturing process.
Figure 6:
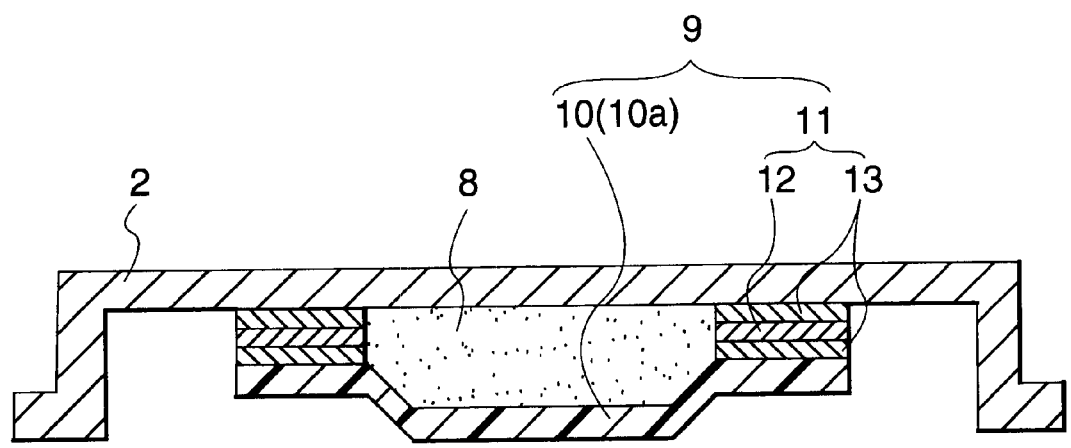
FIG. 6 is a schematic view illustrating the backing substrate of the EL device using the fixing member according to one embodiment of the present invention.

The fixing member 9 of the present invention is, for example, manufactured and fixed inside of an EL device as described below. Described specifically, as illustrated in FIGS. 2 and 3, components of the adhesion member 11 are successively formed into a predetermined shape on the long separator 14, followed by adhesion of the sheet material 10 on the adhesion member 11, whereby a plurality of the fixing members 9 are formed on the separator 14. One of the fixing members 9 on the separator 14 is picked up and is adhered so as to cover the removing agent 8 (refer to FIG. 1), which has been disposed in advance on the dish-like recessed portion of the backing substrate 2 (refer to FIG. 1), by an automatic loading machine, whereby the fixing member 9 is fixed to the EL device. As illustrated in FIG. 6, it is more preferred to attach the removing agent 8 onto the backing substrate 2 in advance, because it makes the manufacturing work of the EL device easier.

According to the above-described embodiment, the fixing member 9 composed of the sheet material 10 equipped with the gas permeable portion 10a having gas permeability and the adhesion member 11 formed at the peripheral portion of the sheet material 10 can be adhered inside of the backing substrate 2 of the EL device, with the removing agent 8 being covered and sandwiched between the backing substrate 2 and the fixing member 9.

Since the fixing member 9 has such a simple structure as being formed of the sheet material 10 and adhesion member 11, the fixing member 9 can be manufactured easily, leading to suppression of the manufacturing cost of the fixing member 9. Moreover, the removing agent 8 can be fixed by such a simple work as adhesion of the fixing member 9 so that the manufacturing cost of the EL device can also be suppressed.

In addition, the removing agent 8 is sandwiched in the covered form between the fixing member 9 and backing substrate 2 so that scattering of the removing agent 8 can be prevented and as a result, the adverse effects of the removing agent 8 on the EL device can be suppressed.

The adhesion member 11 has inside thereof the base layer 12 so that the adhesion member 11 is able to have an increased modulus of elasticity. This enables easy pick up of the fixing member 9 from the separator 14 without causing deformation and therefore, the pick up and subsequent adhesion to the backing substrate 2 can be conducted using an automatic loading machine. By using the fixing member 9, as described above, it becomes possible to carry out the automated production of an EL device and therefore to produce the EL device in a short time at a suppressed manufacturing cost.

Particularly, when a porous substance composed of the above-described PTFE is employed for the gas permeable portion 10a, the resulting EL device can be used stably even under a heated environment because the PTFE is excellent in heat resistance.

When the gas permeable portion 10a is made of a porous substance composed of the high polymer having a crystal structure, the high polymer having a crystal structure permits easy control of the pore size of the porous substance so that the performance of removing a predetermined gas component inside of the EL device can easily be regulated.

When the gas permeable portion 10a is made of a porous substance composed of the thermoplastic resin, excellent processing properties of the thermoplastic resin facilitate the processing of the air permeable portion 10a. Particularly when the thermoplastic resin is a polyolefin-series resin, the polyolefin-series resin permits easy control of the pore size of the porous substance so that the performance of removing a predetermined gas component inside of the EL device can easily be regulated. By the use of an inexpensive polyolefin-series resin, the manufacturing cost of the EL device can be suppressed further. In addition, it is an easily recyclable material so that dust can be reduced by the recycling use of it.

Figure 4:
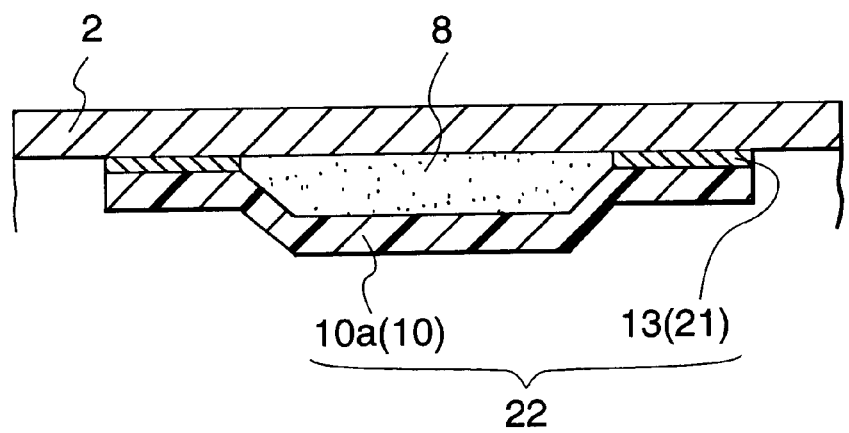
FIG. 4 is a schematic view illustrating the fixing member according to another embodiment of the present invention.

FIG. 4 illustrates a fixing member according to another embodiment of the present invention. In this Embodiment, the gas permeable portion 10a is a porous substance made of a thermoplastic resin in the above-described one embodiment; the adhesion member 21 is formed of the adhesive layer 13 according to the above-described one embodiment but has no base layer 12 (refer to FIG. 1) inside of the adhesion member. Other portions are similar to those of the above-described one embodiment and like members are identified by like reference numerals.

Such a fixing member 22 has no base layer 12 inside of the adhesion member 21 so that in spite that the modulus of elasticity of the adhesion member 21 cannot be increased, that of the fixing member 22 as a whole can be increased because the gas permeable portion 10a is made of a porous substance composed of a thermoplastic resin. Such a constitution makes it possible to pick up the fixing member 22 from the separator 14 (refer to FIG. 2) easily. Thus, similar effects and advantages to the above-described one embodiment are available from this embodiment.

Figure 5:
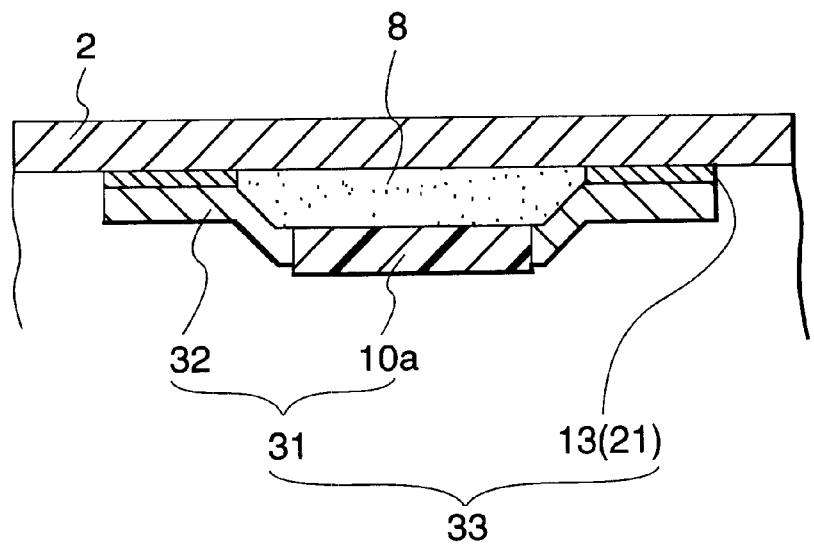
FIG. 5 is a schematic view illustrating the fixing member according to a further embodiment of the present invention.

FIG. 5 illustrates the fixing member according to a further embodiment of the present invention. In this embodiment, the sheet material 31 has, at the central portion thereof, the gas permeable portion 10a similar to that of the above-described one embodiment but the other portion of the gas permeable portion 10a is made of a non-porous substance 32. This non-porous substance 32 is composed of plastics or a metal film. The gas permeable portion 10a and non-porous substance 32 are bonded with an adhesive or pressure-sensitive adhesive. When the non-porous substance 32 is made of a thermoplastic resin, they can be bonded by heat fusion. Other portions are similar to those of the above-described another embodiment and like members are identified by like reference numerals.

When such a fixing member 33 is employed, by changing an area ratio of the gas permeable portion 10a to the non-porous substance 32, the strength of the sheet material 31 or permeability of a gas component can be controlled within a wider range than that controlled only by the gas permeable portion 10a. The pick up ratio from the separator 14 (refer to FIG. 2) can be improved by controlling the strength of the sheet material 31, while the treating rate of a gas component can be regulated by controlling the permeability of the gas component. In addition, similar effects and advantages to those of the above-described one embodiment are available.

In each of the above-described embodiments, the anode 4, organic light emitting layer 5 and cathode 6 are stacked successively over the upper surface of the recessed portion of the surface substrate 1 one after another in this order to form a laminate 7. In addition to these layers, an electron transport layer, a hole transport layer or a hole injection layer may be formed, or a plurality of such layers may be formed.

In a space inside of the EL device, a gas may be sealed hermetically or the space may be evacuated.

There is no particular limitation imposed on the manufacturing process of a porous substance made of the thermoplastic resin. Examples include a manufacturing process by stretching an extruded film, by precipitating a resin, which has been dissolved in a good solvent, in a poor solvent, and by pressing a granular resin under heating to form a porous product and then cutting it into a film.

The present invention will hereinafter be described by Examples and also Comparative Examples.

EXAMPLE 1

The product of Example 1 is a fixing member 9 as illustrated in FIG. 1. First, a polypropylene porous substance (sheet material 10) of 35 μm thick was produced by stretching polypropylene, which had been thermally fused and extruded, at 25° C. at a draw ratio of 1.5 times in a machine direction, stretching again at 130° C. in a machine direction, sizing, and heating at 130° C. for 2 minutes for heat setting. Then, with a polyester film ("Lumirror", trade name; product of Toray Industries, Inc.) of 25 μm thick as a base material, an acrylic pressure-sensitive adhesive to be set by ultraviolet rays was applied to each of the both sides of the base material to give a thickness of 40 μm, whereby an adhesion member 11 was obtained. The above-described pressure-sensitive adhesive was prepared as follows. Described specifically, a premix prepared using 60 parts by weight of isononyl acrylate, 28 parts by weight of butyl acrylate, 12 parts by weight of acrylic acid and 0.1 part by weight of, as a photopolymerization initiator, 2,2-dimethoxy-2-phenylacetophenone ("IRGACURE 651", trade name; product of Ciba Geigy AG) was exposed to ultraviolet rays in a nitrogen atmosphere to cause partial polymerization, whereby a syrup (pressure-sensitive adhesive) having a viscosity of about 4500 cps enough for coating was obtained. The adhesion member 11 was prepared as follows: To 100 parts by weight of the partially polymerized syrup obtained above, added were 0.4 part by weight of tetrabismethylene-3-(3',5'-di-t-butyl-4'-hydroxyphenyl)propionate methane as a radical chain terminator and 0.1 part by weight of trimethylolpropane triacrylate as a crosslinking agent. After they were mixed and applied to the both sides of the base material, photopolymerization was caused by exposing the resulting base material to ultraviolet rays of 900 mJ/cm² from a high-pressure mercury lamp having a light intensity of 5 mw/cm² in a nitrogen gas atmosphere, whereby the adhesion member 11 having a photopolymerized layer of 40 μm thick was obtained. The insoluble content of the resulting pressure-sensitive adhesive in toluene was 90%. The sheet material 10 and adhesion member 11, each thus obtained, were used to manufacture the fixing member 9 as illustrated in FIG. 1 and an EL device as illustrated in FIG. 1 was manufactured using active alumina as the removing agent 8.

A 50-times enlarged photograph of the light emitting layer of the EL device thus obtained was taken rightly after its manufacture. Then, after storage for 500 hours at room temperature, a 50-times enlarged photograph of the light emitting layer of the EL device was taken. As a result of observation and comparison of these enlarged photographs, it has been found that after storage, dark spots showed a 1.1 times growth in area ratio, the fixing member 9 did not drop off in the El device and the pick up properties, which will be described below, were good.

<Pick Up Properties>

The term "pick up properties" means a separation degree of the fixing members 9, which have been successively arranged on a separator, from the separator. When the fixing members 9 were separated naturally from the separator by the rotation of the separator in a 120 degree arc, the pick up properties were judged good, but when they were not separated, the pick up properties were judged bad.

EXAMPLE 2

In a similar manner to Example 1 except for the use of a stainless foil of 25 μm thick instead of the polyester film of 25 μm thick as a base material, enlarged photographs were taken and they were observed and compared. As a result, it has been found that after storage, dark spots showed a growth of 1.1 times in area ratio, the fixing member 9 did not drop off in the EL device and the pick up properties were good.

COMPARATIVE EXAMPLE 1

In a similar manner to Example 1 except that the fixing member 9 and removing agent 8 were omitted, enlarged photographs were taken and they were observed and compared. As a result, it has been found that dark spots showed a growth of 5 times in area ratio.

COMPARATIVE EXAMPLE 2

In a similar manner to Example 1 except that active alumina was disposed on a rectangular enclosure formed on a backing substrate 2, an EL device was formed. Enlarged photographs were taken and they were observed and compared similarly. As a result, it has been found that after storage, dark spots showed a growth of 1.3 times in area ratio, and the removing agent 8 was scattered in the EL device, causing a damage to the cathode.

As described above, the fixing member of the present invention is formed of a sheet material equipped with a gas permeable portion which sheet material covers the removing agent at a portion other than the peripheral portion, and an adhesion member disposed at the peripheral portion of the sheet material. Such a constitution facilitates the adhesion of the removing agent by covering and sandwiching it between the fixing member and the inner wall surface of the EL device, thereby suppressing the manufacturing cost of the EL if device.

When the gas permeable portion of the fixing member of the present invention is made of a porous substance composed of PTFE, its excellent heat resistance makes it possible to use the resulting EL device stably even under a heated environment. When the gas permeable portion is made of a porous substance composed of a high polymer having a crystal structure, the performance of removing a predetermined gas component inside of the EL device can be controlled easily, because the high polymer is a material facilitating the adjustment of the pore size of the porous substance. When the gas permeable portion is made of a porous substance composed of a thermoplastic resin, its excellent processability permits easy processing of the gas permeable portion. Furthermore, when a polyolefin-series resin is used as the thermoplastic resin, the pore size of the porous substance can be adjusted easily, and in addition, the manufacturing cost of the EL device can be reduced more because the polyolefin-series resin is inexpensive. Moreover, since it is an easily-recycled material, the recycling after use contributes to a reduction of dust.

In the fixing member of the present invention, use of an adhesion member having a thickness ranging from 1 to 5000 μm facilitates the handling of the fixing member.

In the fixing member of the present invention, use of an adhesion member formed of a laminate having, inside thereof, a base layer, makes it possible to increase the modulus of elasticity of the adhesion member. According to this advantage, a plurality of fixing members formed on a long separator can be easily picked up from the separator without causing deformation and therefore, automated manufacture of an EL device can be actualized, leading a reduction in time and cost spent for the manufacture of an EL device.

In the EL device using the fixing member of the present invention, the fixing member has a simple structure formed of the above-described sheet material and adhesion member so that it can be adhered to the inner surface of the EL device easily, leading to a suppression of the manufacturing cost thereof.

In the backing substrate for the EL device using the fixing member of the present invention, a removing agent is attached to the backing substrate in advance so that the manufacturing work of the EL device can be conducted easily.

While the invention has been described in detail and with reference to specific embodiments thereof, it will be apparent to one skilled in the art that various changes and modifications can be made therein without departing from the spirit and scope thereof.

What is claimed is:

1. A fixing member for fixing a removing agent of a predetermined gas component, which comprises a sheet material equipped with a gas permeable portion covering said removing agent at a portion other than the peripheral portion of the sheet material, and an adhesion member disposed at the peripheral portion of the gas permeable portion of the sheet material.

2. The fixing member as claimed in claim 1, wherein the gas permeable portion is made of a porous substance composed of polytetrafluoroethylene.

3. A fixing member for fixing a removing agent of a predetermined gas component, which comprises a sheet material equipped with a gas permeable portion covering said removing agent at a portion other than the peripheral portion of the sheet material, and an adhesion member disposed at the peripheral portion of the sheet material, wherein the gas permeable portion is made of a porous substance composed of a high polymer having a crystal structure.

4. A fixing member for fixing a removing agent of a predetermined gas component, which comprises a sheet material equipped with a gas permeable portion covering said removing agent at a portion other than the peripheral portion of the sheet material, and an adhesion member disposed at the peripheral portion of the sheet material, wherein the gas permeable portion is made of a porous substance composed of a thermoplastic resin.

5. The fixing member as claimed in claim 4, wherein the thermoplastic resin is a polyolefin-series resin.

6. The fixing member as claimed in any one of claims 1 to 5, wherein the adhesion member is made of an adhesive and the adhesive has a gel fraction of 70 wt. % or greater in at least one organic solvent selected from the group consisting of toluene, xylene, cyclohexanone, ethanol, isopropyl alcohol, diethyl ether, hexane, carbon tetrachloride, chloroform, dimethylformamide, n-methyl-2-pyrrolidone, and tetrahydrofuran.

7. The fixing member as claimed in any one of claims 1 to 5, wherein the adhesion member has a thickness ranging from 1 to 5000 $\mu$m.

8. The fixing member as claimed in claim 6, wherein the adhesion member has a thickness ranging from 1 to 5000 $\mu$m.

9. The fixing member as claimed in any one of claims 1 to 5, wherein the adhesion member is a laminate having inside thereof a base layer.

10. The fixing member as claimed in claim 6, wherein the adhesion member is a laminate having inside thereof a base layer.

11. The fixing member as claimed in claim 7, wherein the adhesion member is a laminate having inside thereof a base layer.

12. The fixing member as claimed in claim 8, wherein the adhesion member is a laminate having inside thereof a base layer.

13. An electroluminescent device comprising the fixing member as claimed in any one of claims 1 to 5.

14. An electroluminescent device comprising the fixing member as claimed in claim 6.

15. An electroluminescent device comprising the fixing member as claimed in claim 7.

16. An electroluminescent device comprising the fixing member as claimed in claim 8.

17. An electroluminescent device comprising the fixing member as claimed in claim 9.

18. An electroluminescent device comprising the fixing member as claimed in claim 10.

19. An electroluminescent device comprising the fixing member as claimed in claim 11.

20. An electroluminescent device comprising the fixing member as claimed in claim 12.

21. A backing substrate for an electroluminescent device, which comprises the fixing member as claimed in any one of claims 1 to 5.

22. A backing substrate for an electroluminescent device, which comprises the fixing member as claimed in claim 6.

23. A backing substrate for an electroluminescent device, which comprises the fixing member as claimed in claim 7.

24. A backing substrate for an electroluminescent device, which comprises the fixing member as claimed in claim 8.

25. A backing substrate for an electroluminescent device, which comprises the fixing member as claimed in claim 9.

26. A backing substrate for an electroluminescent device, which comprises the fixing member as claimed in claim 10.

27. A backing substrate for an electroluminescent device, which comprises the fixing member as claimed in claim 11.

28. A backing substrate for an electroluminescent device, which comprises the fixing member as claimed in claim 12.

* * * * *